(12) United States Patent
Kim et al.

(10) Patent No.: US 9,673,016 B2
(45) Date of Patent: Jun. 6, 2017

(54) MICRO-ELECTRON COLUMN HAVING AN ELECTRON EMITTER IMPROVING THE DENSITY OF AN ELECTRON BEAM EMITTED FROM A NANO STRUCTURE TIP

(71) Applicant: Industry-University Cooperation Foundation Sunmoon, Asan-si, Chungcheongnam-do (KR)

(72) Inventors: Ho Seob Kim, Incheon (KR); Tae Sik Oh, Cheonan-si (KR); Dae Wook Kim, Seongnam-si (KR); Hyung Woo Kim, Seoul (KR); Seung Jun Ahn, Daejeon (KR)

(73) Assignee: INDUSTRY-UNIVERSITY COOPERATION FOUNDATION SUNMOON UNIVERSITY, Asan-si, Chungcheongnam-Do (KR)

( * ) Notice: Subject to any disclaimer, the term of this patent is extended or adjusted under 35 U.S.C. 154(b) by 0 days.

(21) Appl. No.: 15/048,650

(22) Filed: Feb. 19, 2016

(65) Prior Publication Data

US 2016/0247658 A1     Aug. 25, 2016

(30) Foreign Application Priority Data

Feb. 20, 2015   (KR) .................. 10-2015-0024732

(51) Int. Cl.
*B82Y 10/00*     (2011.01)
*H01J 37/063*    (2006.01)
(Continued)

(52) U.S. Cl.
CPC .......... *H01J 37/065* (2013.01); *H01J 37/073* (2013.01); *H01J 2237/04924* (2013.01);
(Continued)

(58) Field of Classification Search
CPC ........ B82Y 10/00; B82Y 40/00; H01J 37/073; H01J 37/12; H01J 37/3174; H01J 37/28;
(Continued)

(56) References Cited

U.S. PATENT DOCUMENTS

| 5,122,663 A * | 6/1992 | Chang ................... B82Y 10/00 250/310 |
| 6,555,830 B1 * | 4/2003 | Mankos ............... G01N 23/225 250/250 |

(Continued)

*Primary Examiner* — David A Vanore
(74) *Attorney, Agent, or Firm* — John K. Park; Park Law Firm

(57) ABSTRACT

Disclosed is a micro-electron column including nanostructure tips each of which has a tubular, columnar, or blocky structure ranging in size from several nanometers to dozens of nanometers. In the micro-electron column, the nanostructure tips can easily emit electrons because a high electric field is generated at the end of the nanostructure tips when a voltage is applied to the nanostructure tips, and an induction electrode is disposed between the electron emitter and a source lens so as to help electrons emitted from the electron emitter to enter an aperture of a first lens electrode layer of the source lens, thereby realizing improved performance of the micro-electron column. In the micro-electron column, the size of the nanostructure tips may be larger than that of the aperture of a source lens.

6 Claims, 4 Drawing Sheets

(51) Int. Cl.
*H01J 37/147* (2006.01)
*H01J 37/065* (2006.01)
*H01J 37/073* (2006.01)

(52) U.S. Cl.
CPC . *H01J 2237/063* (2013.01); *H01J 2237/0635* (2013.01); *H01J 2237/06341* (2013.01); *H01J 2237/083* (2013.01)

(58) Field of Classification Search
CPC .... H01J 37/3177; H01J 37/063; H01J 37/065; H01J 37/023; H01J 37/067; H01J 37/04; H01J 37/045; H01J 37/06; H01J 37/15; H01J 37/153; H01J 37/244; H01J 37/26; H01J 37/263; H01J 37/3007; H01J 37/302; H01J 37/3045; H01J 1/304; H01J 3/022; H01J 3/028; H01J 3/10; H01J 3/14; H01J 3/021; H01J 31/127; H01J 9/025
USPC ......... 250/396 R, 492.2, 310, 311, 306, 307, 250/397, 398, 423 R, 491.1, 250, 286, 250/396 ML, 492.21, 492.22, 492.3
See application file for complete search history.

(56) References Cited

U.S. PATENT DOCUMENTS

| | | | | |
|---|---|---|---|---|
| 6,593,584 B2* | 7/2003 | Krans | ............... | B82Y 10/00 250/492.2 |
| 7,012,266 B2* | 3/2006 | Jin | ............... | B82Y 10/00 250/423 R |
| 7,060,984 B2* | 6/2006 | Nagae | ............... | B82Y 10/00 250/396 R |
| 7,075,093 B2* | 7/2006 | Gorski | ............... | B82Y 10/00 250/491.1 |
| 7,109,493 B2* | 9/2006 | Eastham | ............... | B82Y 10/00 250/306 |
| 7,279,686 B2* | 10/2007 | Schneiker | ............... | G21K 1/08 250/286 |
| 7,332,729 B1* | 2/2008 | Muray | ............... | B82Y 10/00 250/491.1 |
| 7,332,736 B2* | 2/2008 | Jin | ............... | B82Y 10/00 257/10 |
| 7,750,295 B2* | 7/2010 | Kim | ............... | H01J 3/028 250/310 |
| 7,902,521 B2* | 3/2011 | Kim | ............... | B82Y 10/00 250/310 |
| 8,173,978 B2* | 5/2012 | Kim | ............... | B82Y 10/00 250/306 |
| 2005/0092929 A1* | 5/2005 | Schneiker | ............... | G21K 1/08 250/396 R |
| 2008/0211380 A1* | 9/2008 | Kim | ............... | H01J 31/127 313/495 |
| 2008/0277584 A1* | 11/2008 | Kim | ............... | B82Y 10/00 250/311 |
| 2009/0200482 A1* | 8/2009 | Kim | ............... | B82Y 10/00 250/396 R |
| 2010/0163745 A1* | 7/2010 | Kim | ............... | H01J 37/023 250/396 R |
| 2010/0200766 A1* | 8/2010 | Kim | ............... | H01J 37/065 250/396 R |
| 2011/0079731 A1* | 4/2011 | Kim | ............... | H01J 37/12 250/396 R |
| 2015/0248944 A1* | 9/2015 | Cheng | ............... | H01J 37/153 250/398 |
| 2016/0247657 A1* | 8/2016 | Kim | ............... | H01J 37/063 |

\* cited by examiner

MICRO-ELECTRON COLUMN HAVING AN ELECTRON EMITTER IMPROVING THE DENSITY OF AN ELECTRON BEAM EMITTED FROM A NANO STRUCTURE TIP

CROSS REFERENCE TO RELATED APPLICATION

The present application claims priority to Korean Patent Application No. 10-2015-0024732, filed Feb. 20, 2015, the entire contents of which is incorporated herein for all purposes by this reference.

BACKGROUND OF THE INVENTION

Field of the Invention

The present invention generally relates to a micro-electron column including nanostructure tips that have a tubular, columnar, or blocky structure ranging in size from several nanometers to dozens of nanometers. More particularly, the present invention relates to a micro-electron column including nanostructure tips that can easily emit electrons because a high electric field is generated at the end of the nanostructure tips when a voltage is applied thereto, the micro-electron column being capable of having improved performance by helping the electrons emitted from the nanostructure tips to enter a part of an electron lens, namely an aperture of the electron lens.

Description of the Related Art

The micro-electron column relating to the present invention, which is based on an electron emitter and the microstructural electro-optical components operated under the basic principle of a scanning tunneling microscope (STM), was initially introduced in the 1980's. The micro-electron column is configured such that micro parts are assembled elaborately to minimize optical aberration, thereby realizing an improved electron column. Further, the micro-electron column that is small in size can be efficiently used for a multi-electron column by arranging a plurality of electron columns in parallel or in series. Accordingly, the micro-electron column is being applied to devices that use an electron beam, such as electron microscopes, as well as manufacture devices or inspection devices, which are used in the semiconductor industry or display industry.

FIG. 1 is a view illustrating a structure of a micro electron column, wherein an electron beam is scanned by aligning an electron emitter, a source lens, a deflector, and an einzel lens as a focus lens, in a column.

Generally, a microcolumn, as a representative micro-electron column, includes: an electron emitter 10 that emits electrons; a source lens 20 that forms the emitted electrons into an effective electron beam B; a deflector 30 that deflects the electron beam B; and a focus lens (an einzel lens, 40) that focuses the electron beam B on a specimen S.

The electron emitter, which is one of the major components of a conventional electron beam device, such as an electron column or an electron microscope, is classified into a FE (field emitter), a TE (thermal emitter), a Schottky Emitter as a TFE (thermal field emitter), etc. An ideal electron emitter requires efficient electron emission, high brightness, a small virtual beam size, high density current emission, low energy spread, and a long lifespan.

There are two types of micro-electron columns: a single electron column that includes an electron emitter, and electron lenses for controlling an electron beam generated from the electron emitter; and a multi-type electron column that includes a plurality of electron emitters, and a plurality of electron lenses for controlling electron beams generated from the plurality of electron emitters. The multi-type electron column is classified into the following categories: a wafer-type electron column that is similar to a semiconductor wafer and includes an electron emitter having a plurality of electron emitter tips provided on one substrate, and an electron lens formed by layering a plurality of lens layers, the lens layers being provided with a plurality of apertures on one substrate; a combination-type electron column that controls electron beams emitted from respective electron emitters in a manner similar to a single electron column, with lens layer having a plurality of apertures on one substrate; and another type electron column that is formed by arranging single electron columns in one housing. Herein, the lenses of the combination-type electron column may be used in the same manner as those of the wafer-type electron column, except for the difference that the electron emitters are separately divided.

The above described micro-electron column is a major tool in the fields of electron beam lithography, electron microscopes, etc., where electron beams are used to inspect a semiconductor hole, such as a via hole or a through hole.

Further, in the field of electron columns or in other application fields of electron beams, only when an electron emitter is accurately aligned at the center of an optical axis of an electron lens (particularly, a source lens), a device or equipment using an electron column or an electron beam can show the best performance. Further, the higher the density of the electron beam that is scanned toward a specimen along the optical axis is, the higher the performance can be. In other words, resolution can be increased with higher electron density. Thus, in order to increase the density of the electron beam, it is important that as many electrons as possible enter the aperture of the source lens.

In particular, in the fields of semiconductors and displays, the structures of elements of a device, such as a semiconductor or display, are becoming microscopic while the overall size of the manufactured product is becoming larger. As a technology and a device for precisely and rapidly processing, measuring, and inspecting such a microstructure, a variety of devices using an electron beam are increasingly required. Accordingly, a multi-type electron column capable of improving productivity is increasingly required, and accordingly an electron emitter corresponding to the multi-type electron column is also increasingly required.

The foregoing is intended merely to aid in the understanding of the background of the present invention, and is not intended to mean that the present invention falls within the purview of the related art that is already known to those skilled in the art.

Documents of Related Art (Patent Document) Korean Patent Application Publication No. 10-2010-0037095 (Dated on Apr. 8, 2010)

SUMMARY OF THE INVENTION

Accordingly, the present invention has been made keeping in mind the above problems occurring in the related art, and the present invention is intended to propose a micro-electron column having nanostructure tips that are capable of emitting electrons even at a low voltage, and can be manufactured and used with ease, unlike conventional electron emitters. The present invention is also intended to propose a micro-electron column for helping electrons emitted from the nanostructure tips to enter the aperture of a source lens so as to increase the density of an electron beam of the micro-electron column.

In order to achieve the above object, according to one aspect of the present invention, there is provided a micro-electron column including an electron emitter, a source lens, a deflector, and a focus lens, wherein the electron emitter includes a plurality of nanostructure tips and emits electrons, and an induction electrode is disposed between the electron emitter and the source lens so as to help electrons from the electron emitter to enter the aperture of a first lens electrode layer of the source lens.

Further, according to the present invention, the size of the aperture of the first lens electrode layer of the source lens may be smaller than the size of the aperture of a second lens electrode layer of the source lens based on the electron emitter.

Further, according to the present invention, the aperture of the second lens electrode layer of the source lens may be at least five times larger in size than the aperture of the first lens electrode layer of the source lens.

Further, according to the present invention, the induction electrode may include at least two electrode pieces.

Further, the present invention may provide a multi-type micro-electron column, assuming that the unit electron column is the above mentioned micro-electron column.

The present invention configured as described above is advantageous in that the micro-electron column is capable of emitting electrons even at low voltage, and can be manufactured and used with ease, unlike conventional electron emitters.

Further, the present invention is advantageous in that the micro-electron column induces electrons emitted from the nanostructure tips to enter the aperture of a source lens, thereby increasing the density of the electron beam of the micro-electron column.

Further, the present invention is advantageous in that in the micro-electron column, the electron emitter can be made in such a way that a plurality of electron emitters are provided on one substrate, such as a silicon wafer, whereby it is possible to reduce manufacturing cost, and possible to produce electron emitters that can be efficiently used in a multi-type micro-electron column. When the electron emitters are formed on a wafer, a multi-type electron emitter can be made by making the electron emitters cooperating with respective electron lenses, or a multi-type micro-electron column can be made by individually cutting the electron emitters into single electron emitters.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
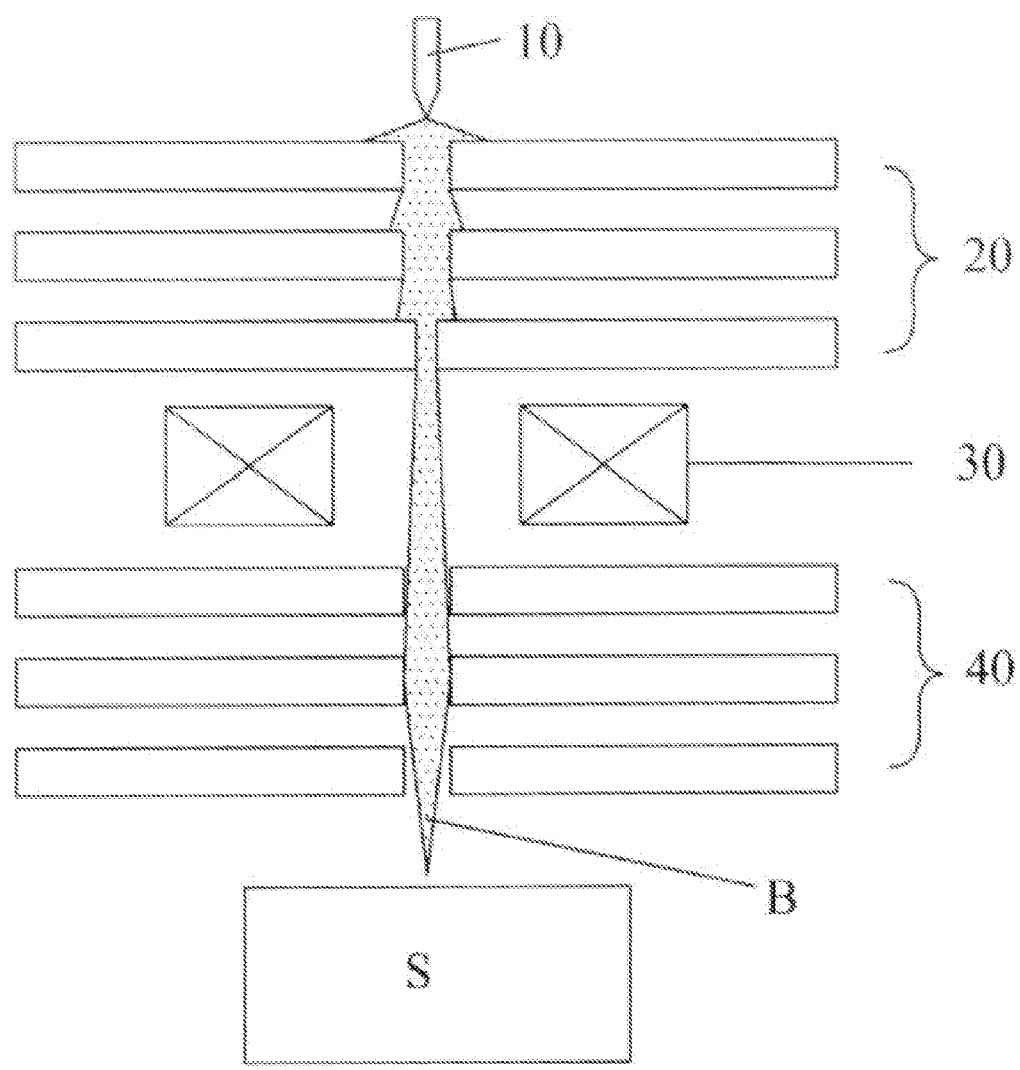
FIG. 1 is a schematic sectional view illustrating a structure of a conventional micro-electron column.

To achieve above described objects of the present invention, nanostructure tips of an electron emitter may be distributed on an area larger than the size of an aperture of a first lens electrode layer of a source lens, based on the electron emitter.

Hereinbelow, exemplary embodiments of the present invention will be described in detail with reference to the accompanying drawings. Throughout the drawings, the same reference numerals will refer to the same or like parts.

Figure 2:
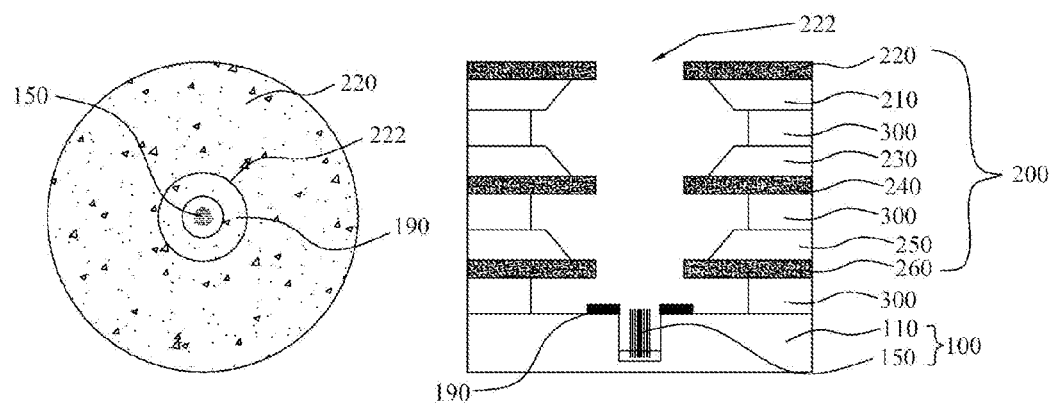
FIG. 2 illustrates plane and sectional views of a first embodiment of a micro-electron column having nanostructure tips according to the present invention.

FIG. 2 illustrates an example of a use of a micro-electron column having nanostructure tips according to a first embodiment of the present invention, wherein the left drawing of FIG. 2 is a plane view illustrating a state where the nanostructure tips are disposed at the bottom of the micro-electron column, and the right drawing is a sectional view illustrating the same.

As shown in FIG. 2, the micro-electron column according to the first embodiment of the present invention is configured such that a source lens 200 is aligned on an electron emitter 100 having a plurality of nanostructure tips 150. An induction electrode 190 is provided at a location adjacent to the end of the nanostructure tips 150. As shown in FIG. 2, the induction electrode 190 may have the same structure and shape as a typical electrostatic lens electrode. However, features of the induction electrode 190, such as external diameter, aperture, or thickness, are determined based on the nanostructure tips 150, unlike the aperture of the typical lens electrode. For example, as shown in FIG. 2, the size of the aperture of the induction electrode 190 is configured to be smaller than the size of a lens electrode aperture of the source lens 200, and also the external diameter and thickness of the induction electrode 190 are configured to be smaller than those of the source lens 200. The shape of the induction electrode 190 may be configured to have a thickness that allows the induction electrode 190 to be disposed between the nanostructure tips 150 and the source lens 200, and configured to have a larger aperture than the diameter or the cross section of the nanostructure tips 150 so as to accommodate the nanostructure tips 150 within the aperture of the induction electrode 190. Here, it is preferred that the size of the aperture of the induction electrode 190 is smaller than the size of a first electrode aperture of the source lens 200. Further, it is preferred that a negative voltage is applied to the induction electrode 190, wherein the value of the negative voltage is lower than that of a negative voltage applied to the nanostructure tips 150, and higher than that of a negative voltage applied to a first electrode layer 260 of the source lens 200, based on an absolute value. Further, it is preferred that the ends of the nanostructure tips 150 are disposed within a range defined by the thickness of the induction electrode 190 from a contact surface of the induction electrode 190 such that electrons emitted from the nanostructure tips 150 can be efficiently oriented toward the aperture of the first electrode layer 260 of the source lens 200, passing by the aperture of the induction electrode 190.

The source lens 200 includes three electrode layers 220, 240, and 260, wherein each of the electrode layers is a highly doped part and includes respective silicon layers 210, 230, and 250. Each of the electrode layers 220, 240, and 260, similar to the electron emitter, is highly doped on a silicon substrate to form a membrane, and is provided with an aperture 222 at a center of the membrane so as to allow an electron beam to pass therethrough. The lowermost electrode layer 260 having a silicon layer 250 is called an extractor in the electron column and serves to help the nanostructure tips 150 of the electron emitter 100 to easily emit electrons. The middle electrode layer 240 having a silicon layer 230 is called an accelerator in the electron column and serves to accelerate the electrons emitted from the nanostructure tips 150. The uppermost electrode layer 220 having a silicon layer 210 is called a limiting aperture in the electron column and serves to form the emitted electrons into an effective electron beam. In other words, the source lens 200 mainly serves to convert the electrons emitted from the electron emitter 100 into an electron beam, and also serves to perform focusing, etc. If necessary, the silicon layers 210, 230, and 250 may be removed.

For the purpose of insulation, the source lens 200 may include an insulating layer 300, such as Pyrex, which is disposed between each of the electrode layers and a neighboring electrode layer. Further, another insulating layer 300, such as Pyrex, may be provided between the extractor and the electron emitter 100 for the purpose of insulation.

FIG. 2 is an example of the micro-electron column having the electron emitter according to the present invention. The source lens itself may be combined with the separate electron emitter, but it is preferred that the silicon substrate of the electron emitter, along with the source lens, is manufactured through a semiconductor manufacturing process in order to make alignment and manufacturing thereof more efficient.

In the present invention, the nanostructure tips 150 are disposed within a tip base 110 made of a material similar to the silicon wafer to form the electron emitter 100. Each of the nanostructure tips 150 has a tubular, columnar, or blocky structure ranging in size from several nanometers to dozens of nanometers, such as a CNT (carbon nanotube), a zinc oxide nanotube (ZnO nanotube), a nanorod, a nanopillar, a nanowire, or a nanoparticle, etc. Here, each of the nanostructure tips 150 means a tip that can easily emit electrons because a high electric field is generated at the end of the nanostructure tip when a voltage is applied to the nanostructure tip.

Figure 3:
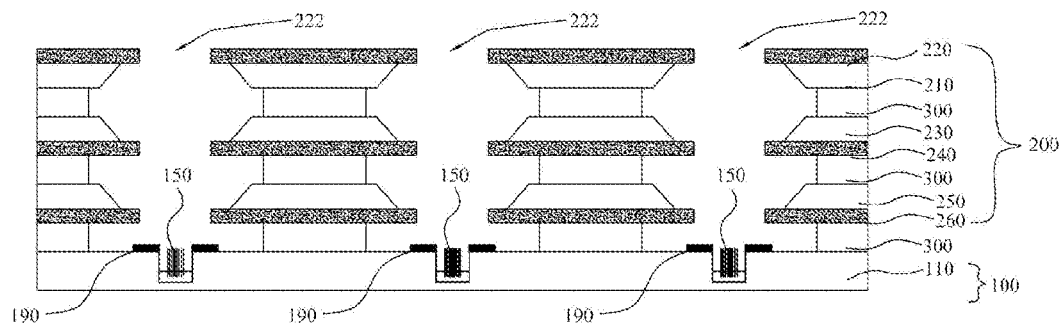
FIG. 3 illustrates plane and sectional views of a multi-type electron column having a plurality of electron columns of FIG. 2.
Figure 3:
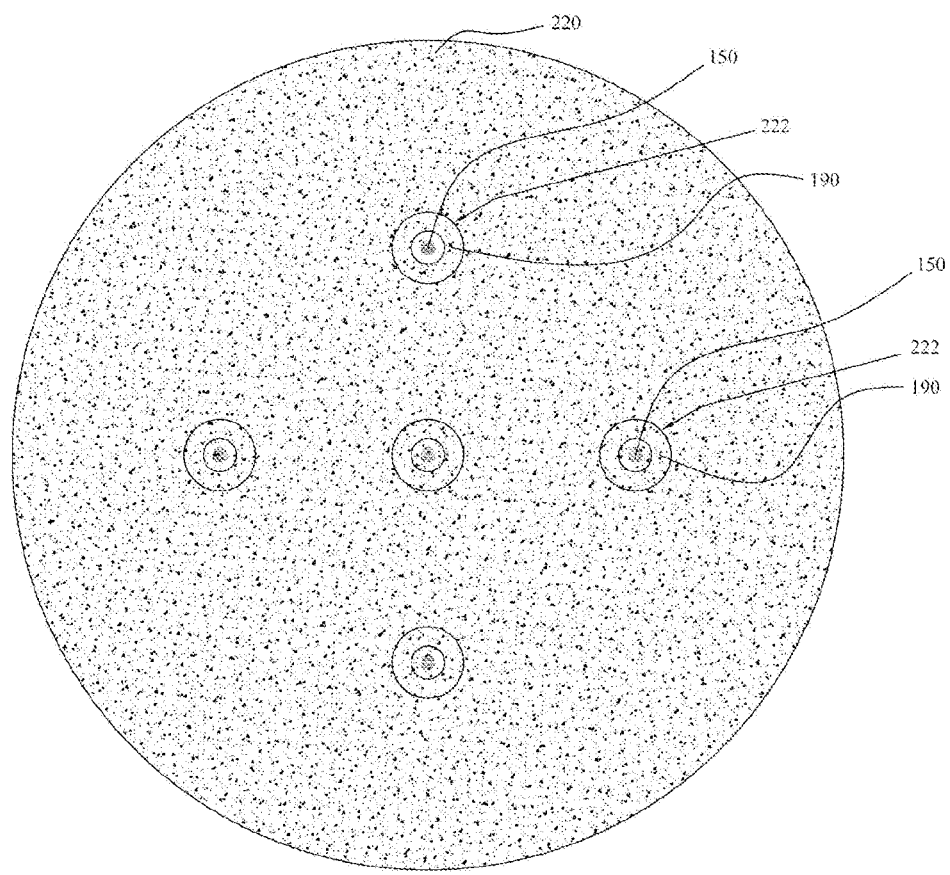

FIG. 3 illustrates a multi-type electron column comprising a plurality of micro-electron columns of FIG. 2. In FIG. 3, the micro-electron column may be layered in the same manner as FIG. 2. The electron emitter 100 according to the present invention may include a plurality of the nanostructure tips 150, and thus FIG. 3 illustrates a state where the electron lens (particularly, the source lens) is aligned in the same manner as FIG. 2.

FIG. 3 illustrates a multi-type electron column including five unit electron columns, assuming that the unit electron column is one unit for forming the electrons emitted from the nanostructure tips 150 into an electron beam. In FIG. 3, all of the nanostructure tips 150 of the electron emitters 100 are formed on one substrate, wherein the same voltage may be applied thereto, or if necessary, a voltage may be individually applied to the nanostructure tips 150 of the electron emitters 100. In the case where it is required to individually apply a voltage to the nanostructure tips 150 of the electron emitters 100, the voltage may be individually applied to the nanostructure tips 150 of the electron emitters 100 by sectioning the substrate at locations around the nanostructure tips 150 or by sectioning the electrode layer adjacent to the electron emitters, so that the application of voltage can be controlled by using the difference in voltage between each of the nanostructure tips 150 and the adjacent electrode layer. In FIG. 3, the electrode layer 220 is formed into one layer (one substrate), and respective apertures 222 are provided in the respective unit electron columns. Each of the electrode layers 220, 240 and 260 may be individually formed on one substrate so as to be sectioned into unit electron columns, so that a voltage can be applied to each of the apertures 222 individually, in a manner similar to the nanostructure tips. To achieve this, a manufacturing method for a conventional multi-type column, for example, a method disclosed by WO 2006/004374 (published Jan. 12, 2006), may be used.

Figure 4:
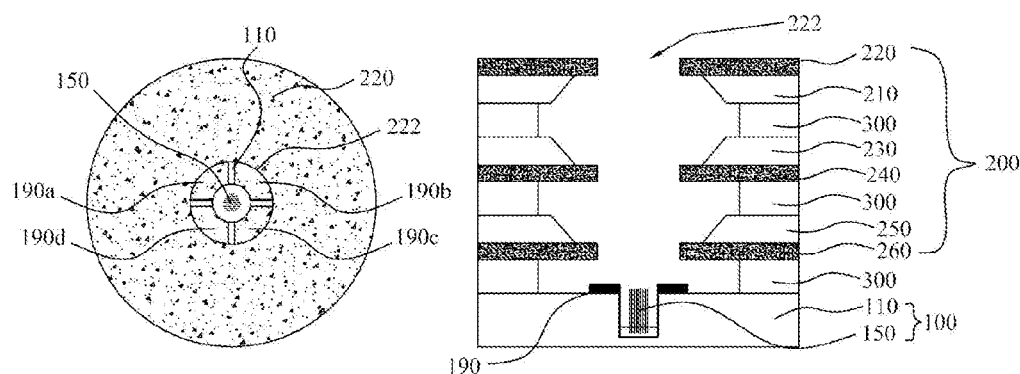
FIG. 4 illustrates plane and sectional views of a second embodiment of the micro-electron column having nanostructure tips according to the present invention.

FIG. 4 illustrates plane and sectional views of a second embodiment of the micro-electron column having nanostructure tips according to the present invention. In comparison with the micro-electron column of FIG. 2, the micro-electron column of FIG. 4 is configured such that the induction electrode 190 disposed between the electron emitter 100 and the source lens 200 is divided into four pieces. The induction electrode 190 efficiently induces the electrons emitted from the nanostructure tips 150 to enter the aperture 222 of the source lens 200, and also is capable of realigning a direction of an electron beam. The induction electrode 190 may be arrayed with a larger aperture than the aperture 222 of the source lens 200. However, in FIG. 4, the aperture of the induction electrode 190 is smaller in size than the aperture 222 of the source lens as in FIG. 2. The induction electrode 190 may be formed to have four electrode pieces 190a, 190b, 190c, and 190d. The induction electrode 190, however, may have at least two electrode pieces, or may have at least three electrode pieces to improve directivity. The more electrode pieces the induction electrode has, the more precisely the direction of the electron beam may be realigned. However, to achieve this, it is required to have a plurality of control electrodes and to control the electrode pieces. Thus, it is preferred that the induction electrode 190 has at most eight electrode pieces. Consequently, the induction electrode 190 preferably has four or eight electrode pieces.

As a voltage may be individually applied to each of the electrode pieces 190a, 190b, 190c, and 190d, it is possible for the electrode pieces to which relatively larger negative voltage is applied to push the electrons in an opposite direction, thereby enabling realigning the direction of the electron beam. Therefore, in the case where the electrons fail to proceed along an optical axis, a result of the realignment can be more dramatic.

Figure 5:
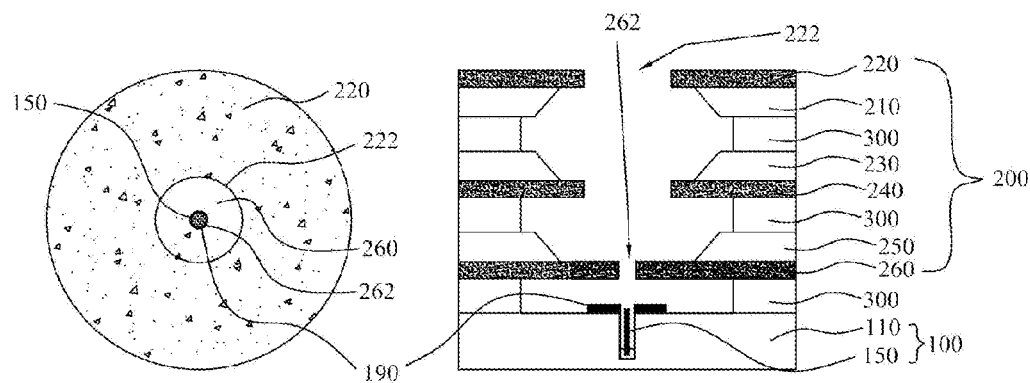
FIG. 5 illustrates plane and sectional views of a third embodiment of the micro-electron column having nanostructure tips according to the present invention.

FIG. 5 illustrates plane and sectional views of a third embodiment of the micro-electron column having nanostructure tips according to the present invention. In comparison with the micro-electron columns of FIGS. 2 and 4, the micro-electron column of FIG. 5 is configured such that the aperture 262 of the electrode layer 260 of the source lens 200, through which the electrons emitted from the electron emitter 100 firstly pass, is much smaller in size than the apertures 222 of the other electrode layers 220 and 240 of the source lens 200. The reason why the aperture 262 of the electrode layer 260 is small in size is to enable selecting electrons that move well in straight lines along the electron optical axis at the center of the aperture of the source lens 200, among all the electrons emitted from the electron emitter. In other words, even though the volume of the electrons that pass through the source lens 200 may be decreased by selecting preferable electrons that move well in straight lines along the electron optical axis, it is possible to considerably increase resolution. That is because a spot of the electron beam that reaches the specimen can be small by precisely focusing on the specimen. It is preferred that the aperture 262 of the electrode layer 260 is at least five times smaller in size than the apertures 222 of other electrode layers 240 and 220 of the source lens 200, particularly, smaller than the aperture of the second electrode 240. If necessary, the aperture of the third or a following electrode of the source lens may be smaller than the aperture of the second electrode 240. Therefore, it is preferred that the size of the aperture 262 of the electrode layer 260 is smaller than that of the aperture of a following electrode layer, namely the second electrode layer 240. The third embodiment of FIG. 5 may be adapted to both the first embodiment of FIG. 2 and the second embodiment of FIG. 4.

As the embodiment of FIG. 5, when the electrode layer 260 has a small aperture 262, the plurality of nanostructure tips 150 may be arrayed in an area larger than the size of the aperture 262 of the electrode layer 260. Further, in the other embodiments, the plurality of the nanostructure tips 150 may be arrayed in an area larger than the size of the aperture 262 of the electrode layer 260 if necessary.

Further, other than the first embodiment of FIG. 2, various embodiments including the second and the third embodiments of FIGS. 4 and 5 may be formed into a multi-type micro-electron column in the same manner as that described for FIG. 3.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A micro-electron column comprising an electron emitter, a source lens, a deflector, and a focus lens, wherein
the electron emitter comprises a plurality of nanostructure tips and emits electrons, and
an induction electrode is disposed between the electron emitter and the source lens so as to help electrons emitted from the electron emitter to enter an aperture of a first lens electrode layer of the source lens.

2. The micro-electron column of claim 1, wherein
the aperture of the first lens electrode layer of the source lens is smaller in size than an aperture of a second lens electrode layer of the source lens based on the electron emitter.

3. The micro-electron column of claim 2, wherein
the induction electrode comprises at least two electrode pieces.

4. A multi-type micro-electron column comprising a plurality of unit micro-electron columns, wherein each of the unit micro-electron columns is the micro-electron column according to claim 1.

5. A multi-type micro-electron column comprising a plurality of unit micro-electron columns, wherein each of the unit micro-electron columns is the micro-electron column according to claim 2.

6. A multi-type micro-electron column comprising a plurality of unit micro-electron columns, wherein each of the unit micro-electron columns is the micro-electron column according to claim 3.

* * * * *